United States Patent

Nag

Patent Number: 6,127,285
Date of Patent: Oct. 3, 2000

[54] INTERLEVEL DIELECTRICS WITH REDUCED DIELECTRIC CONSTANT

[75] Inventor: Somnath S. Nag, Saratoga, Calif.

[73] Assignee: Dallas Instruments Incorporated, Dallas, Tex.

[21] Appl. No.: 09/023,915

[22] Filed: Feb. 13, 1998

Related U.S. Application Data

[60] Provisional application No. 60/039,655, Feb. 28, 1997.

[51] Int. Cl.[7] .................................................. H01L 21/31
[52] U.S. Cl. .......................... 438/788; 438/695; 438/787
[58] Field of Search .................................. 438/788, 695, 438/787

[56] References Cited

U.S. PATENT DOCUMENTS

| | | | |
|---|---|---|---|
| 4,883,766 | 11/1989 | Ishida et al. | 437/40 |
| 5,494,859 | 2/1996 | Kapoor | 437/235 |
| 5,626,679 | 5/1997 | Shimzu et al. | 118/723 MR |
| 5,679,606 | 10/1997 | Wang et al. | 437/195 |
| 5,716,888 | 2/1998 | Lur et al. | 438/619 |
| 5,744,399 | 4/1998 | Rostoker et al. | 438/622 |
| 5,750,211 | 5/1998 | Weise et al. | 427/579 |
| 5,915,190 | 12/1995 | Pirkle | 438/424 |

OTHER PUBLICATIONS

Wolf, S. "Silicon Processing For The VLSI Era" vol. 2 (1990). Lattice Press. Sunset, CA. pp. 237–238, 1990.

*Primary Examiner*—Charles Bowers
*Assistant Examiner*—Erik Kielin
*Attorney, Agent, or Firm*—Wade James Brady III; Frederick J. Telecky, Jr.

[57] ABSTRACT

A structure and method to further reduce the dielectric constant (capacitance) of high density plasma chemical vapor deposited silicon dioxide ($SiO_2$ 12). The dielectric constant of voids (i.e. air pockets) is close to k=1.0, and therefore the microvoids reduce the effective dielectric constant of the silicon dioxide 12. Use of HDPCVD conditions avoids residual hydrogen, which would degrade the dielectric constant.

5 Claims, 1 Drawing Sheet

INTERLEVEL DIELECTRICS WITH REDUCED DIELECTRIC CONSTANT

This is a Non Provisional application filed under 35 USC 119(e) and claims priority of prior provisional, Ser. No. 60/039,655 of inventor Somnath S. Nag, filed Feb. 28, 1997.

BACKGROUND AND SUMMARY OF THE INVENTION

The present invention relates to plasma processing conditions used in semiconductor processing, particularly to those used for high density plasma enhanced chemical vapor deposition.

With decreasing transistor gate-lengths and increasing on-chip device densities, the delay at the interconnections has become the determining factor for device speeds at the sub-half micron design level. This is primarily because of increasing lead-lengths and decreasing inter/intra-level dielectric thicknesses, which increases the capacitance and leads to higher RC-time delays. Parasitic capacitance of conductors hurts performance in at least two ways: first, the distributed capacitive load on wiring will slow down the propagation of signals. Secondly, the capacitive coupling between adjacent lines can cause "cross-talk," where a pulse on one line is coupled into an adjacent line. This can lead to unpredictable logic errors. Various solutions have been identified to solve the problem of RC time-delays, such as polymers and organic spin-on materials, but these have yet to gain the level of maturity of CVD silicon dioxide.

The basic HDPCVD process is already well-established in the semiconductor industry. The high density plasma (HDP) source, in combination with a bias RF supply, is normally used for enhanced gap filling and planarization at the smaller geometries and aggressive aspect-ratios for sub 0.5 micrometer technologies. The HDPCVD deposition process involves a simultaneous deposition and etch component.

Parasitic capacitance can be reduced by using insulation with a lower dielectric constant k. Fluorine doping of silicon dioxide deposits using a high-density plasma has been found to lower the dielectric constant from k=4.2 to k=3.0. In order to reduce the dielectric constant to a value between 3.0 and 3.2, a fluorine-containing gas such as CF4, C2F6, or SiF4 is added to the plasma. This results in a high-density fluorinated silica film with a microvoid density usually less than 1%. However, for many applications, the dielectric constant of the silicon dioxide must be further reduced to eliminate the problems of parasitic capacitance and thus, RC time-delays.

Work was previously done by the present inventor to introduce microvoids into silicon; with this disclosure, the use of microvoids is being extended into dielectric insulator materials, in order to lower the dielectric constant.

A previous attempt in this area is discussed in Ceiler et al., "Plasma-Enhanced Chemical Vapor Deposition of Silicon Dioxide Deposited at Low Temperatures", 142 *J. Electrochemical Soc.* 2067 (1995). This article shows an SiO2 film deposited from 2% silane (in nitrogen) reacted with nitrous oxide. As disclosed therein, this process experienced problems with residual silanol and water being trapped in the film. Since the inclusion of these impurities increases the dielectric constant of the layer, this is counter-productive. Thus, Ceiler appears to teach away from the use of porosity in dielectric layers to decrease permittivity.

Reduced-Dielectric Constant Porous Structures and Methods

In contrast, the process disclosed herein uses a high density plasma chemical vapor deposition (HDPCVD) process to form a micro-porous dielectric layer without —OH bonds. This process uses high ionization densities and does not produce the problems with silanol and water inclusions. The presently preferred embodiment utilizes oxygen and silane as the precursors in the HDPCVD process, and the resulting film contains microvoids (i.e. gas pockets which are less than 100 nanometers) without inclusions of high-dielectric-constant compounds such as silanol and water. The microvoids have a dielectric constant close to k=1.0, and therefore reduce the effective dielectric constant of the silicon dioxide. Control of the deposition process (in particular, the temperature and rate of deposition) allows these microvoids to be formed without residual hydrogen in the film (and consequently without —OH bonds). Additionally, in the disclosed SiH4/O2 oxide deposition process, an oxygen-rich plasma causes an even lower density in the film by promoting a high microvoid concentration.

Advantages of the disclosed methods and structures include:

reduced parasitic capacitance and RC time-delays in interconnect structures;

simple process scheme using the standard chemistry for HDPCVD dielectrics;

doping of silicon dioxide need not be used, eliminating potential reliability issues; and allows use of CVD silicon dioxide, which is well understood, in smaller geometries.

BRIEF DESCRIPTION OF THE DRAWING

The disclosed inventions will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
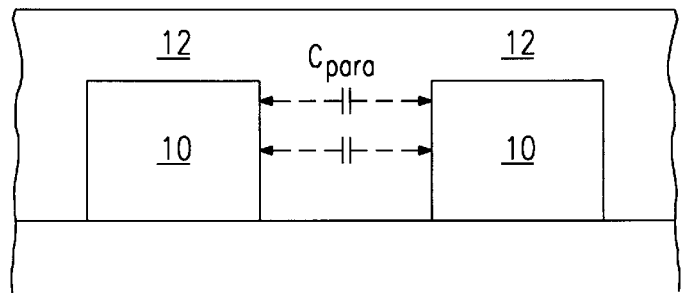
FIG. 1 schematically illustrates a structure containing interconnections.

FIG. 1 schematically illustrates a structure containing metal interconnections 10 which are insulated from each other by a dielectric 12. The disclosed process introduces microvoids into the dielectric 12 to further reduce the effective dielectric constant. This lowers the capacitive loading seen by each of the interconnects 10, which in turn increases the propagation speed of the interconnections and allows the speed of the chip to increase. Moreover, the parasitic capacitance Cpara between adjacent interconnects is also reduced (for a given geometry), which reduces the risk of crosstalk.

Figure 2:
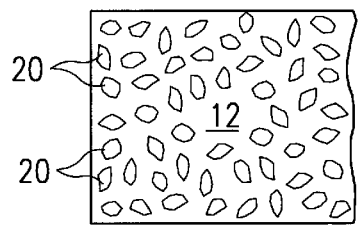
FIG. 2 depicts an enlarged layer of a dielectric, such as silicon dioxide, having an increased microvoid density.

FIG. 2 depicts an enlarged layer of a dielectric, such as silicon dioxide, having a high fraction of microvoids 20. These microvoids 20 are less than 100 nanometers in diameter (and are believed to be in the range of 30–50 nanometers with the process described below). To maintain the small size of these microvoids and avoid the problems previously encountered with hydrogen inclusion in porous dielectrics, HDPCVD is utilized, preferably combined with low temperature (e.g., a wafer temperature of 200–250 degrees C.) and a very low dielectric deposition rate (e.g., 0.3 to 1.0 nm/second). (By contrast, the old SILOX processes would typically run at deposition rates in the neighborhood of about 12 nm/second. Also, conventional plasma oxide process would produce larger void sizes, unlike the microvoids produced by the present invention.)

The deposition temperature is one important parameter for controlling the micro-void density of the film. As the growth surface temperature is lowered, the surface-mobility of the growth precursor is reduced, thereby increasing the sticking coefficient of the adatoms. This results in a film with a less dense structure.

Embodiment: SiO2 Deposition

The presently preferred embodiment is used to deposit SiO2, due to the level of maturity of the technology in this area. In this embodiment, the SiO2 is deposited using O2 and SiH4 as precursors, with the following deposition power characteristics:

Source: 3 kW

Bias: 1250 W

Under these conditions, tests were run in an AMI "Ultima" reactor with varying ratios of O2 to SiH4 and under two different pressures, with the results shown below:

| O2 (sccm) | SiH4 (sccm) | He Pr. (mTorr) | W.E.R. (nm/m) |
|---|---|---|---|
| 42 | 29.9 | 2000 | 90 |
| 60 | 29.9 | 2000 | 91 |
| 84 | 29.9 | 2000 | 93 |
| 42 | 29.9 | 5000 | 102 |
| 60 | 29.9 | 5000 | 133 |
| 84 | 29.9 | 5000 | 145. |

As can be seen from the data above, a decrease in the deposition temperature (increase in the wafer-backside He pressure) causes a significant increase in the wet etch rate (W.E.R., measured here in 1% BHF). W.E.R. is generally inversely proportional to the film-density. The higher helium flows (5000 milliTorr) in this process example produce wafer temperatures in the range from 200–250 degrees C., while the lower flows (2000 milliTorr) produce wafer temperatures in the range from 400–450 degrees C. (The susceptor temperature run about 30 degrees lower.)

Additionally, in a SiH4/O2 oxide deposition process, an oxygen-enriched plasma leads to a lower-density film. This is particularly noticeable in the higher pressure version shown above. The plasma composition can be controlled for this such that the trapped microvoids in the oxide contain gases of lower dielectric constant. The O2/SiH4 ratio in the HDPCVD process is known to cause a large drop in refractive index (which indicates a drop in density) when changing from a silicon-rich plasma to an oxygen-rich plasma. Any further increase in the O2/SiH4 ratio in the oxygen-rich regime causes the refractive index to continue to drop at a lower rate. Preferably, the ratio of O2 to SiH4 is 2:1 or higher.

Other process parameters can also be varied. For example, reduction in bias power tends to produce lower temperature and less densification.

For closed microvoids (such as are present in the disclosed inventive process) having a dielectric constant of k1 and a volumetric fraction of x1, and considering that the dielectric constant of SiO2 is k=4.2, the effective dielectric constant keff is:

keff=[n1k1+(100−x1)k]100.

Thus, by increasing the fraction of microvoids, the effective dielectric constant of the silicon dioxide is reduced.

Figure 3:
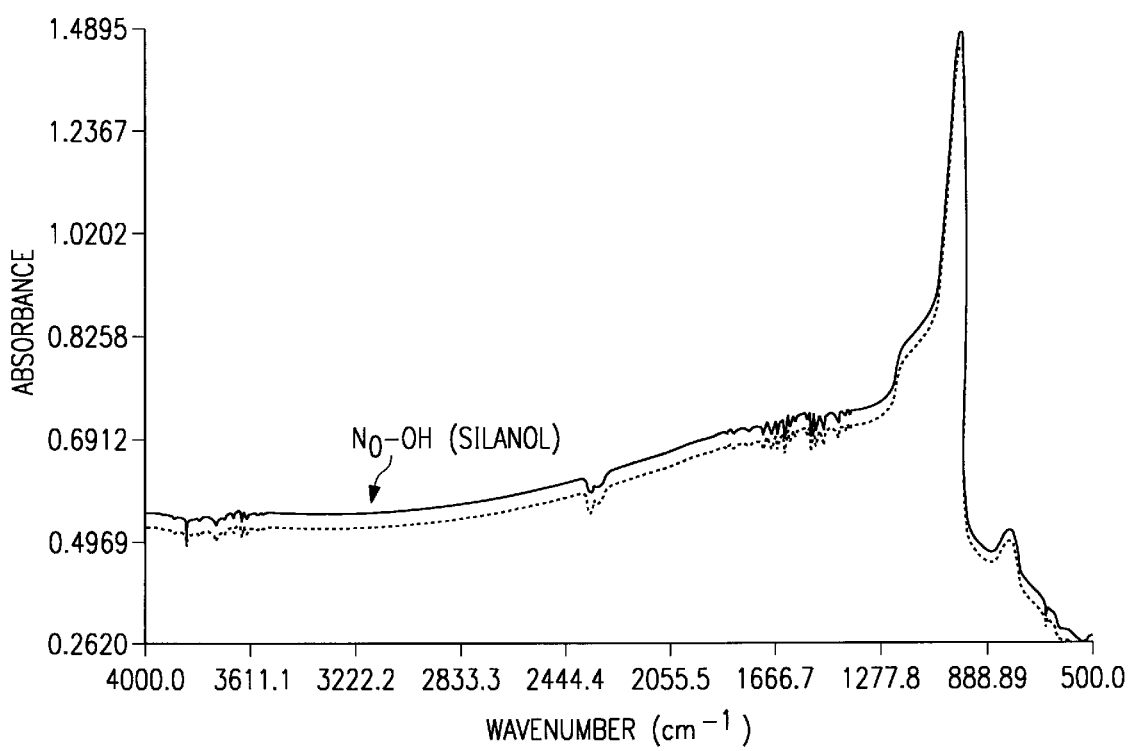
FIG. 3 shows a graph of an SiO2 layer deposited using the presently preferred embodiment of the disclosed process, showing no silanol inclusions.

FIG. 3. shows FTIR characterization results from an SiO2 layer deposited using the presently preferred embodiment of the disclosed process. The presence of a hydroxyl (—OH) group would give a peak at k=3650 cm−1. The absence of such a peak shows that silanol is not present in the film.

Alternate Embodiment: Oxynitride

In this embodiment, an oxynitride layer is formed using HDPCVD. Normal deposition parameters are followed, except that the wafer temperature is less than 300 degrees C. and the deposition rate is less than 5 nm/sec.

Alternate Embodiment: Oxyfluoride

In this alternative embodiment, HDPCVD is used to deposit a layer of silicon oxyfluoride. A low-temperature deposition with a greatly decreased deposition rate is used to achieve a void size of less than 100 nm and a density of voids greater than one percent. It is predicted that a reduced dielectric constant results.

Alternate Embodiment: Silicate Glass

In this alternative embodiment, dopants such as phosphine and diborane are introduced, along with the silane/oxygen flow, to deposit BPSG. Other conditions are as described above.

According to a disclosed class of innovative embodiments, there is provided: A method of reducing the effective dielectric constant of dielectric material, comprising the steps of: a) depositing a dielectric layer at a low temperature to introduce microvoids of less than 100 nm diameter into said dielectric layer; wherein the density of said microvoids in said dielectric layer is greater than one percent.

According to another disclosed class of innovative embodiments, there is provided: A method of reducing the effective dielectric constant of dielectric material, comprising the steps of: a) depositing an HDPCVD dielectric layer comprising at least 25 percent atomic of silicon, at least 50 percent atomic of oxygen, and less than 1 percent atomic of hydrogen on a partially fabricated integrated circuit structure to introduce microvoids into said dielectric layer; wherein the density of said microvoids in said dielectric layer is greater than one percent.

According to another disclosed class of innovative embodiments, there is provided: An integrated circuit structure, comprising: a dielectric layer having microvoids of less than 100 nm diameter which comprise at least 1 percent of the volume of said dielectric layer; whereby the effective dielectric constant of said dielectric layer is reduced.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Of course, the specific etch chemistries, layer compositions, and layer thicknesses given are merely illustrative, and do not by any means delimit the scope of the claimed inventions.

What is claimed is:

1. A method of reducing the effective dielectric constant of dielectric material, comprising the steps of:

depositing a dielectric layer, under high-density-plasma-chemical-vapor-deposition conditions, which comprises at least 25 percent atomic of silicon, at least 50 percent atomic of oxygen, and less than 1 percent atomic of hydrogen on a partially fabricated integrated circuit structure to introduce microvoids into said dielectric layer;

wherein the volumetric fraction of said microvoids in said dielectric layer is greater than one percent and the density of said microvoids is increased by decreasing the temperature of deposition of said dielectric layer.

2. The method of claim 1, wherein said step of depositing is performed at a temperature less than 300 degrees C.

3. The method of claim 1, wherein said step of depositing is performed using an O2:SiH4 ratio of 2:1 or greater.

4. The method of claim 1, wherein said microvoids are less than 100 nm in diameter.

5. The method of claim 1, wherein said deposition rate is less than 5 nm/sec.

* * * * *

UNITED STATES PATENT AND TRADEMARK OFFICE
CERTIFICATE OF CORRECTION

PATENT NO : 6,127,285
DATED : Oct. 3, 2000
INVENTOR(S) : Somnath Nag

It is certified that error appears in the above-identified patent and that said Letters Patent is hereby corrected as shown below:

Assignee should read: "Texas Instruments Incorporated."

Signed and Sealed this

Twenty-second Day of May, 2001

Attest:

NICHOLAS P. GODICI

Attesting Officer

Acting Director of the United States Patent and Trademark Office